United States Patent [19]
Chen et al.

[11] Patent Number: 5,807,789
[45] Date of Patent: Sep. 15, 1998

[54] METHOD FOR FORMING A SHALLOW TRENCH WITH TAPERED PROFILE AND ROUND CORNERS FOR THE APPLICATION OF SHALLOW TRENCH ISOLATION (STI)

[75] Inventors: Chao-Cheng Chen, Tainan; C. S. Tsai, Hsinchu; C. H. Yu, Keelung, all of Taiwan

[73] Assignee: Taiwan Semiconductor Manufacturing, Co., Ltd., Hsinchu, Taiwan

[21] Appl. No.: 821,353

[22] Filed: Mar. 20, 1997

[51] Int. Cl.$^6$ ...................................................... H01L 21/76
[52] U.S. Cl. ........................... 438/714; 438/701; 438/713; 438/978; 438/424; 438/734
[58] Field of Search ...................................... 438/424, 421, 438/700, 701, 713, 714, 909, 978, 734; 216/2, 63

[56] References Cited

U.S. PATENT DOCUMENTS

| | | |
|---|---|---|
| 4,349,409 | 9/1982 | Shibayama et al. . |
| 4,456,501 | 6/1984 | Bayman et al. . |
| 5,460,689 | 10/1995 | Raaijmakers et al. . |
| 5,474,650 | 12/1995 | Kumihashi et al. . |

Primary Examiner—George R. Fourson
Attorney, Agent, or Firm—Pennie & Edmonds LLP

[57] ABSTRACT

The present invention is a method for forming a shallow trench with tapered profile and round corners for the application of shallow trench isolation (STI). This invention utilizes a multiple-step dry etching process with reduced RF power and increased pressure to etch a shallow trench. This takes advantage of different degree of polymer deposition in different steps by varing the pressure and the RF power. Thus, a shallow trench with tapered profile and round corners is achieved.

28 Claims, 3 Drawing Sheets

METHOD FOR FORMING A SHALLOW TRENCH WITH TAPERED PROFILE AND ROUND CORNERS FOR THE APPLICATION OF SHALLOW TRENCH ISOLATION (STI)

FIELD OF THE INVENTION

The present invention relates to a shallow trench isolation process and, more particularly, to a method for forming a shallow trench with tapered profile and round corners.

BACKGROUND OF THE INVENTION

Shallow trench isolation has been an alternative for LOCOS isolation for 0.25micron technology and beyond. It is known that trench profile is a major contributing factor in generating substrate defect during routine process steps required for device/circuit fabrication, especially in the following trench-fill step. Conventionally, round bottom corners are formed to smooth the trench sidewall in order to minimize the generated defect and improve the gap-filling ability. Currently, most shallow trenches obtained by conventional methods have steep sidewall profiles (>80°) and sharp corners. These cause the gap filling problems and result in gate oxide thinning and stress concentration problems. The aforementioned phenomena become worse as the devices are scaled down, and therefore the leakage of the current will further effect the performance of the device and the refresh time of the device.

FIGS. 1–3 are cross section views of a semiconductor wafer illustrating various stages of forming shallow trenches according to a conventional method. Referring to FIG. 1, an oxide layer 12 is formed on a substrate 10. The oxide layer 12 serves as a pad oxide layer. The silicon dioxide layer 12 is formed to a thickness of approximately 110 angstroms. A silicon nitride layer 14 is then formed on the oxide layer 12. The silicon nitride layer 14 is about 1700 angstroms thick. Next, the oxide layer 12 and said nitride layer 14 are patterned and etched to form the trenches on the substrate. First, the oxide layer 12 and the nitride layer 14 are masked by a patterned mask 15. Then, the oxide layer 12 and the nitride layer 14 uncovered by the mask 15 are removed. An etching method (indicated by arrows 16) is performed to remove the oxide layer 12 and the nitride layer 14. The etching method is a plasma etching method. The plasma etching method is performed using $CHF_3$, $CF_4$, Ar, and $O_2$ gases. The plasma etching method is achieved using a $CHF_3$ gas flow of about 10 sccm, a $CF_4$ gas flow of about 15 sccm, an Ar gas flow of about 100 sccm, and an $O_2$ gas flow of about 5 sccm, with a radio-frequency(RF) of about 400 W and a process pressure of about 50 mT.

After that, an etching process 17 is performed to etch the substrate 10 in order to form the shallow trenches. The remained oxide layer 12 and the remained nitride layer 14 serve as hard masks. The etching process 17 is a plasma etching process. The plasma etching method is performed using HBr, $Cl_2$, $HeO_2$, and $CF_4$ gases. The plasma etching method is performed by changing the reaction condition to following parameters: the HBr gas flow is about 100 sccm, the $Cl_2$ gas flow is about 20 sccm, the $HeO_2$ gas flow is about 30 sccm, and a $CF_4$ gas flow is about 20 sccm, the radio-frequency (RF) is about 650 W and the process pressure is about 100 mT. The resulting structure is shown in FIG. 3 in which it is easy to find that the shallow trenches have steep sidewall profiles (>80°) and sharp corners.

Then, an oxidation process is usually performed to modify the shallow trenches. Typically, round corners are achieved by growing a thin oxide layer. Unfortunately, if sharp corners are left after the previous etching step, the round corners got from the oxidation process usually give unsatisfactory roundness because of a limit to the rounding ability of the thin oxide layer.

SUMMARY OF THE INVENTION

In accordance with the present invention, a method for forming shallow trenches with tapered profile and round corners for the application of shallow trench isolation is provided. The method of this invention is to form shallow trenches on a wafer, wherein the wafer has a semiconductor substrate. Then, an oxide layer is formed on the semiconductor substrate, and a nitride layer is formed on the oxide layer. In one embodiment, the method includes patterning the oxide layer and the nitride layer; first etching the substrate according to the pattern of said oxide layer and said nitride layer, wherein the first etching is performed with a first set of process parameters; second etching the substrate, wherein the second etching process is performed with a second set of process parameters, which is performed by reducing the RF power of the first set of process parameters and increasing the process pressure of the first set of process parameters; third etching said substrate to form shallow trenches with tapered profile and round corners, wherein the third etching process is performed with a third set of process parameters, wherein the third set of process parameters is performed by reducing the RF power of the second set of process parameters and increasing the process pressure of the second set of process parameters. Unlike the conventional method, a shallow trench having round trench top corners and round trench bottom corners is obtained by the method of this invention. Thus, the problems of gate oxide thinning and the defect generation are eliminated. In addition, the sidewall slope of trench profile can be reduced to facilitate gap filling.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

In accordance with the present invention, the dry etching process module consists of two stages. The first stage is to define the trench opening by etching through the silicon nitride and pad oxide layers. Then, the second stage is to form the shallow trench with the desired sloped sidewall profile and round corners by etching into the silicon substrate. A multiple-step dry etching is performed in the second stage. Preferably, a 3-step dry etching is performed in the second stage. Detailed description of this invention is described hereafter.

Figure 1:
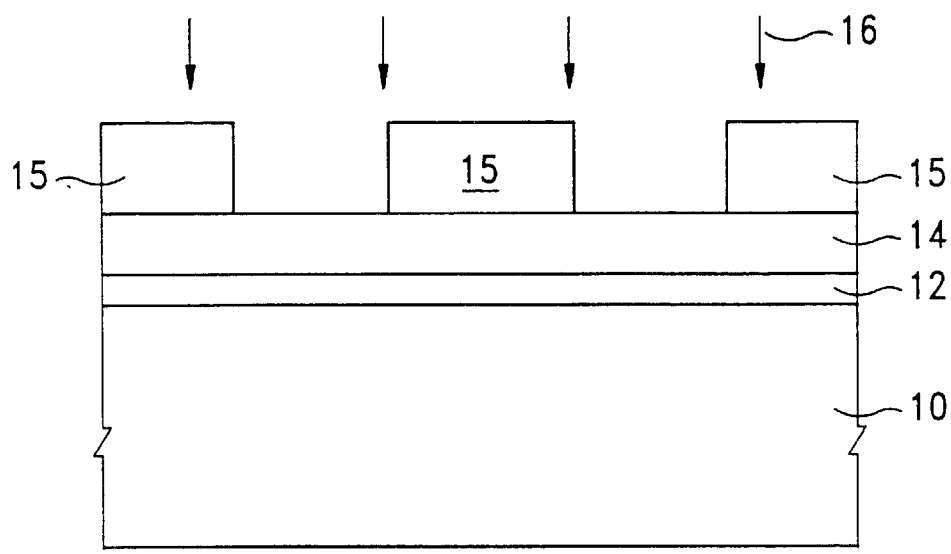
FIGS. 1–3 are cross section views of a semiconductor wafer illustrating various stages of forming shallow trenches according to the conventional method.
Figure 2:
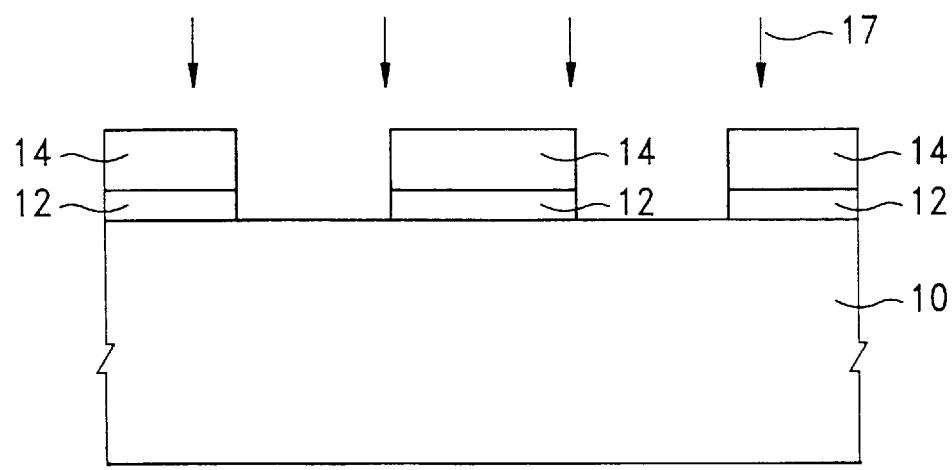
Figure 3:
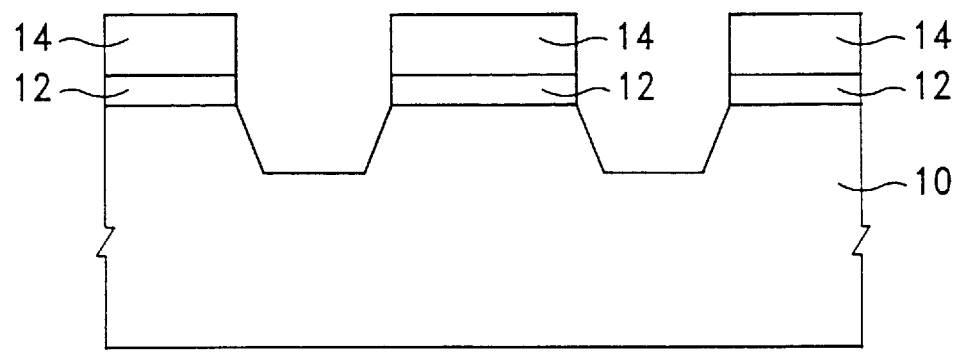
Figure 4:
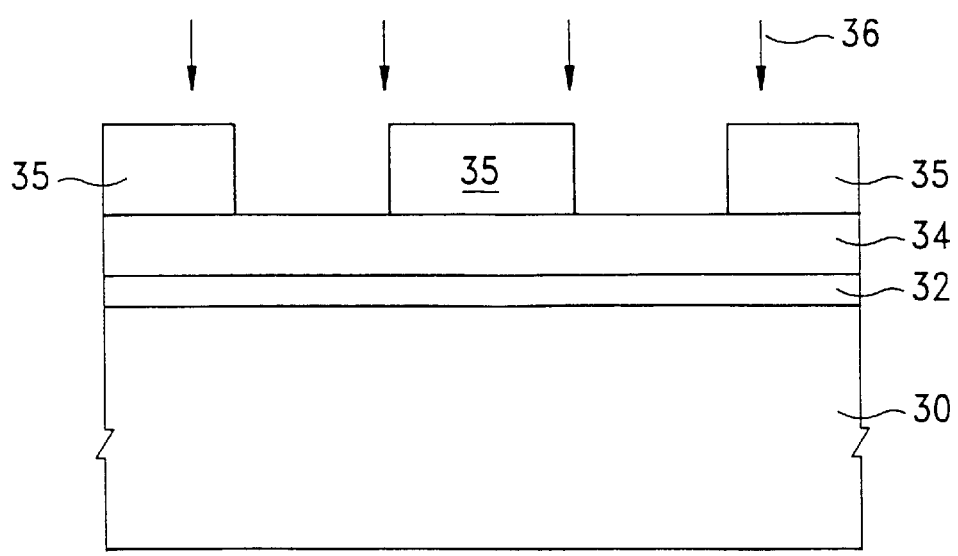
FIGS. 4–6 are cross section views of a semiconductor wafer illustrating various stages of forming shallow trenches according to one embodiment of the present invention.
Figure 5:
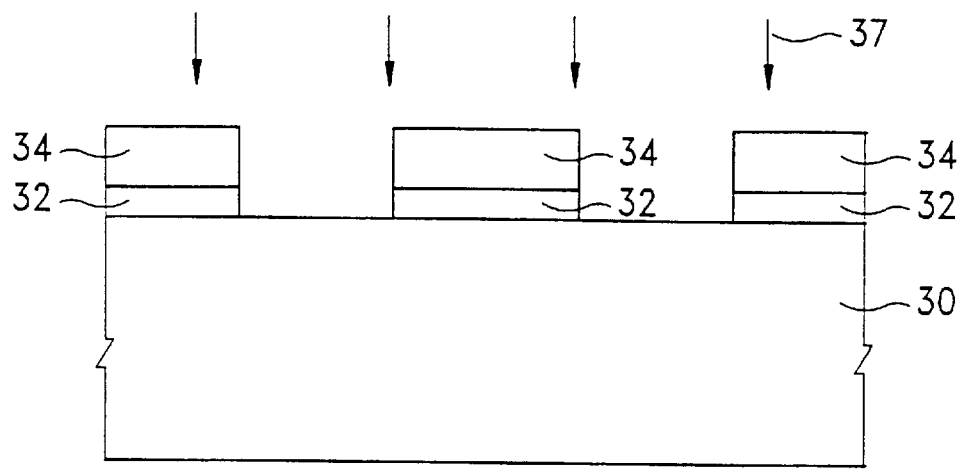
Figure 6:
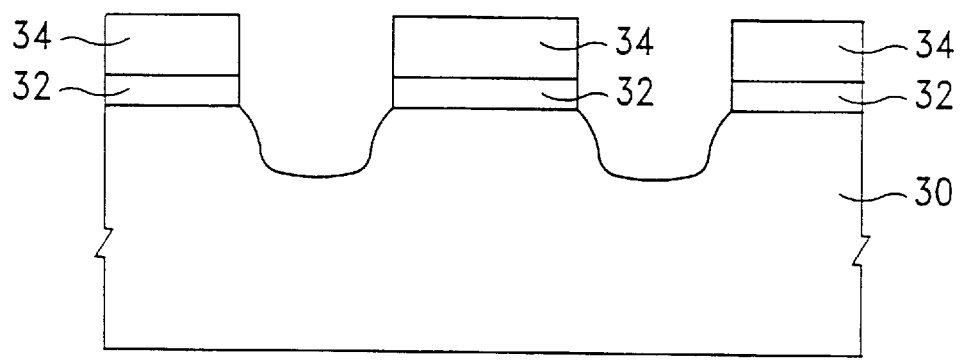

FIGS. 4–6 are cross section views of a semiconductor wafer illustrating various stages of forming shallow trenches according to one embodiment of the present invention. Referring to FIG. 4, an oxide layer 32 is formed on the substrate 30. The oxide layer 32 serves as a pad oxide layer. In this embodiment, the oxide layer 32 is a silicon dioxide layer. The oxide layer 32 can be formed by any suitable method. The silicon dioxide layer 32 is formed by using an oxygen-steam ambient, at a temperature of about 850°–1000°C. Alternatively, the oxide layer 32 may be formed using any suitable oxide chemical compositions and procedures. In this embodiment, the silicon dioxide layer 32 is formed to a thickness of approximately 110 angstroms. A silicon nitride layer 34 is then formed on the oxide layer 32. In this embodiment, the silicon nitride layer 34 is deposited by using well-known methods such as a chemical vapor deposition process. The silicon nitride layer 34 is about 1700 angstroms thick. Next, the oxide layer 32 and the nitride layer 34 are patterned and etched to form the trenches on the substrate 30. First, the oxide layer 32 and the nitride layer 34 are masked by a patterned mask 35. Then, the oxide layer 32 and the nitride layer 34 uncovered by the mask 35 are removed. In this embodiment, an etching method (indicated by arrows 36) is performed to remove the oxide layer 32 and the nitride layer 34. The etching method is a plasma etching method. The plasma etching method is performed using $CHF_3$, $CF_4$, Ar, and $O_2$ gases. The plasma etching method is achieved using a $CHF_3$ gas flow of about 10 sccm, a $CF_4$ gas flow of about 15 sccm, an Ar gas flow of about 100 sccm, and an O2 gas flow of about 5 sccm, with a radio-frequency (RF) of about 400 W and a process pressure of about 50 mT. The resulting structure is shown in FIG. 5.

After that, an etching process 37 is performed to etch the substrate 30 in order to form the shallow trenches. The remained oxide layer 32 and the remained nitride layer 34 serve as hard masks. The etching process 37 is a multiple-step dry etching process. Typically, a 3-step dry-etching process is performed to form the desired structure of the shallow trenches. Same etchant gases such as HBr, $Cl_2$, $CF_4$ and $HeO_2$, are chosen for all these steps to avoid discontinuity in the profile. However, the parameters of the RF power and the process pressure among these steps are different in order to obtain varied degree of polymer deposition in each step. By applying the strongest polymer deposition in the first step, round top corners can be achieved using the highest value of the RF power about 800 W and lowest value of the process pressure about 50 mT among these 3 steps. The third step provides the lowest but enough deposition degree to obtain round bottom corners using the lowest value of RF power and highest value of process pressure. The amount of polymer forming from the 3-step dry-etching process is determined by the gas ratio for HBr to $Cl_2$ and the slope of profile is also determined by the gas ratio for HBr to $Cl_2$. Typical the gas ratio for HBr to $Cl_2$ is 5. A ratio smaller than 4 would lead to vertical profile. On the other hand, in the case of ratio larger than 6, etch stop might occur, especially together with high flow rate of $HeO_2$ (larger than 30 sccm). In this embodiment, the etching process 37 is a 3-step dry etching process. The etching process 37 is a plasma etching process. The plasma etching method is performed using HBr, $Cl_2$, $HeO_2$, and $CF_4$ gases. In this embodiment, the first step of the etching process 37 is achieved using a HBr gas flow of about 100 sccm, a $Cl_2$ gas flow of about 20 sccm, a $HeO_2$ gas flow of about 30 sccm, a $CF_4$ gas flow of about 20 sccm, with a radio-frequency(RF) of about 800 W and a process pressure of about 50 mT. The first step of the etching process 37 is performed about 8 seconds. In the second step of the etching process 37, the parameter of the RF power is changed by decreasing about 10% from 800 W down to 700 W and the parameter of the process pressure is also changed by increasing about 60% from 50 mT to 80 mT. The other parameters of the second step of the etching process 37 keep the same conditions as the parameters of the second step of the etching process 37. For example, the gas flow of HBr is about 100 sccm, the gas flow of $Cl_2$ is about 20 sccm, the gas flow of $HeO_2$ is about 30 sccm, and the gas flow of $CF_4$ is about 20 sccm. The second step of the etching process 37 is performed about 8 seconds. In the third step of the etching process 37, the parameter of the RF power is changed by decreasing about 20% from 800 W down to 650 W and the parameter of the process pressure is also changed by increasing about 100% from 50 mT to 100 mT. The other parameters of the third step of the etching process 37 keep the same conditions as following: the gas flow of HBr is about 100 sccm, the gas flow of $Cl_2$ is about 20 sccm, the gas flow of $HeO_2$ is about 30 sccm, and the gas flow of $CF_4$ is about 20 sccm. The third step of the etching process 37 is performed about 46 seconds. The resulting structure is shown in FIG. 6.

The method of this invention takes advantage of different degree of the polymer deposition in the 3-step etching process by varing the process pressure and RF power. Thus, the shallow trenches with round corners are obtained. In addition, the sloped trench sidewall profile can be achieved by controlling the gas ratio for HBr to $Cl_2$. A shallow trench having round trench top corners and round trench bottom corners is obtained by the method of this invention. Therefore, the problems of gate oxide thinning and the defect generation are eliminated. In addition, the sidewall slope of trench profile can be reduced to facilitate gap filling.

Although specific embodiment has been illustrated and described, it will be obvious to those skilled in the art that various modifications, such as changing the parameters of the RF power and the process pressure in the etching process, may be made without departing from the which is intended to be limited solely by the appended claims.

The embodiments of the invention in which an exclusive property or privilege is claimed are defined as follows:

1. A method for forming shallow trenches with tapered profile and round corners on a wafer, said wafer having a semiconductor substrate, wherein an oxide layer is formed on said semiconductor substrate and a nitride layer is formed on the said oxide layer, said method comprising:

patterning said oxide layer and said nitride layer to form trenches;

first etching said substrate according to the pattern of said oxide layer and said nitride layer, wherein said first etching is performed with a first set of process parameters;

second etching said substrate, wherein said second etching process is performed with a second set of process parameters, wherein said second set of process parameters is performed by reducing the RF power of said first set of process parameters level and increasing the process pressure of said first set of process parameters level; and third etching said substrate to form shallow trenches with tapered profile and round corners, wherein said third etching process is performed with a third set of process parameters, wherein said third set of process parameters is performed by reducing the RF power of said second set of process parameters level and increasing the process pressure of said second set of process parameters level.

2. The method according to claim 1, wherein removing portion of said oxide layer and said nitride layer comprises etching by a plasma etching process.

3. The method according to claim 2, wherein said plasma etching process comprises using $CHF_3$, $CF_4$, Ar, and $O_2$ gases.

4. The method according to claim 1, wherein first etching said substrate comprises etching by a plasma etching process.

5. The method according to claim 4, wherein said plasma etching process comprises using HBr, $Cl_2$, $HeO_2$, and $CF_4$ gases.

6. The method according to claim 5, wherein the gas ratio for said HBr to said $Cl_2$ is in a range of about 4 to 6.

7. The method according to claim 1, wherein said first set of process parameters has a RF power of about 800 W.

8. The method according to claim 1, wherein said first set of process parameters has a process pressure of about 50 mT.

9. The method according to claim 1, wherein second etching said substrate comprises etching by a plasma etching process.

10. The method according to claim 9, wherein said plasma etching process comprises using HBr, $Cl_2$, $HeO_2$, and $CF_4$ gases.

11. The method according to claim 10, wherein the gas ratio of said HBr to said $Cl_2$ is in a range of about 4 to 6.

12. The method according to claim 9, wherein said plasma etching process has a RF power in the range of about 720 W to 680 W.

13. The method according to claim 9, wherein said plasma etching process has a process pressure in the range of about 70 mT–90 mT.

14. The method according to claim 1, wherein third etching said substrate comprises etching by a plasma etching process.

15. The method according to claim 14, wherein said plasma etching process comprises using HBr, $Cl_2$, $HeO_2$, and $CF_4$ gases.

16. The method according to claim 15, wherein the gas ratio of said HBr to said $Cl_2$ is in a range of about 4 to 6.

17. The method according to claim 14, wherein said plasma etching process has a RF power in the range of about 640 W to 664 W.

18. The method according to claim 14, wherein said plasma etching process has a process pressure in the range of about 90 mT–110 mT.

19. A method for forming shallow trenches with tapered profile and round corners on a wafer, said wafer having a semiconductor substrate, wherein an oxide layer is formed on said semiconductor substrate, and a nitride layer is formed on the said oxide layer, said method comprising:

patterning said oxide layer and said nitride layer;

first etching said substrate according to the pattern of said oxide layer and said nitride layer, wherein said first etching is performed with a set of process parameters,;

second etching said substrate, wherein said second etching process is performed by reducing the RF power approximate 10% below said set of process parameters level and increasing the process pressure approximate 60% above said set of process parameters level; and third etching said substrate to form shallow trenches with tapered profile and round corners, wherein said third etching process is performed by reducing approximate 20% below said set of process parameters level and increasing the process pressure approximate 100% above said set of process parameters level.

20. The method according to claim 19, wherein first etching said substrate comprises etching by a plasma etching process.

21. The method according to claim 20, wherein said plasma etching process comprises using HBr, $Cl_2$, $HeO_2$, and $CF_4$ gases.

22. The method according to claim 21, wherein the gas ratio of said HBr and said $Cl_2$ is in a range of about 4 to 6.

23. The method according to claim 19, wherein said set of process parameters has a RF power about 800 W.

24. The method according to claim 19, wherein said set of process parameters has a process pressure about 50 mT.

25. The method according to claim 19, wherein said second etching comprises performed with a RF power in the range of about 720 W to 680 W.

26. The method according to claim 19, wherein said second etching process comprises performed with a process pressure in the range of about 70 mT to 90 mT.

27. The method according to claim 19, wherein said third etching process comprises performed with a RF power in the range of about 640 W to 664 W.

28. The method according to claim 19, wherein said third etching process comprises performed with a process pressure in the range of about 90 mT–110 mT.

* * * * *